United States Patent [19]
Kanezuka

[11] 4,016,430
[45] Apr. 5, 1977

[54] MIS LOGICAL CIRCUIT

[75] Inventor: Tadao Kanezuka, Tokorozawa, Japan

[73] Assignee: Hitachi, Ltd., Japan

[22] Filed: Dec. 23, 1975

[21] Appl. No.: 643,772

[30] Foreign Application Priority Data

Jan. 6, 1975 Japan .......................... 50-000105

[52] U.S. Cl. .............................. 307/205; 307/214; 307/215
[51] Int. Cl.² .................. H03K 19/08; H03K 19/20
[58] Field of Search .......... 307/205, 214, 270, 304, 307/215, 213; 340/324 R, 336, 343; 350/160 LC

[56] References Cited

UNITED STATES PATENTS

| 3,818,245 | 6/1974 | Suzuki et al. ................... 307/304 X |
| 3,944,848 | 3/1976 | Heeren .............................. 307/205 |

OTHER PUBLICATIONS

Wyland, "FET Cascode Technique Optimizes Differential Amplifier Performance", *Electronics*, (pub.) pp. 81–84; 1/18/1971.

*Primary Examiner*—John S. Heyman
*Assistant Examiner*—Larry N. Anagnos
*Attorney, Agent, or Firm*—Craig & Antonelli

[57] ABSTRACT

In a logical circuit comprising a load and a driving MISFET, a depletion type MISFET is connected between the load and the driving MISFET and a voltage which has a smaller absolute value than the absolute value of the difference between a supply voltage and a threshold voltage of the depletion type MISFET is impressed on the gate electrode of the depletion type MISFET.

4 Claims, 2 Drawing Figures

MIS LOGICAL CIRCUIT

BACKGROUND OF THE INVENTION

1. Field of the Invention

This invention relates to a logical circuit which is constructed of insulated gate field-effect transistors (hereinbelow termed "MISFETs").

2. Description of the Prior Art;

Logical circuits which are constructed of MISFETs (hereinafter termed "MIS logical circuits") are broadly classified into a ratio type logical circuit and a ratioless type logical circuit. In the former, the output level is determined by the ratio $g_{mr}$ between the mutual conductances of a load MISFET and a driving MISFET, so that the gate area of the driving MISFET becomes large. Also, a d.c. current flows through the load MISFET and the driving MISFET, so that the power dissipation becomes high.

In the latter, the output level is determined independently of the ratio of the mutual conductances as stated above. More specifically, a circuit of this type precharges a load capacitor and acquires an output level in dependence on whether or not the stored charge is discharged in conformity with an input signal at the next timing. Therefore, the gate area of a driving MISFET is small, and the power dissipation is low. On the other hand, however, a clock pulse circuit for the precharging is required.

In the logical circuits as described above, a supply voltage is sometimes applied between the drain and source of the driving MISFET constituting a logical block which is connected between an output terminal and a reference voltage terminal (earth terminal). For this reason, the channel length of the driving MISFET must be determined in dependence on the supply voltage in order to prevent punch-through between the drain and source.

Accordingly, the ratio type logical circuit must have the ratio $g_{mr}$ between the conductances of the load MISFET and the driving MISFET at a predetermined value and must be designed in consideration of the limitation of the channel length of the driving MISFET. The ratioless type logical circuit cannot put the driving MISFET into a required minimum size due to the limitation of the channel length, and must be designed in consideration of the supply voltage.

SUMMARY OF THE INVENTION

This invention has been made in order to solve the above problem, and has for its object to provide an MIS logical circuit which has an enhanced degree of freedom of design.

The fundamental construction of this invention for accomplishing the object resides in a logical circuit constructed at least of a load and a driving MISFET, characterized in that a depletion type MISFET is connected between the load and the driving MISFET and that a voltage which has a smaller absolute value than the absolute value of the voltage difference between the supply voltage and a threshold voltage of said depletion type MISFET is applied to a gate electrode of said depletion type MISFET.

DETAILED DESCRIPTION

Figure 1:
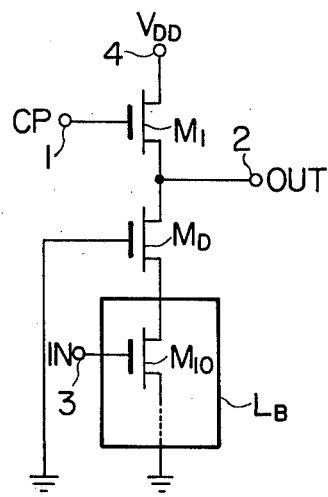
FIGS. 1 and 2 are circuit diagrams each showing an embodiment of this invention.

With reference to FIG. 1 between a load MISFET $M_1$ and a logical block $L_B$ which is composed of at least one driving MISFET $M_{10}$, there is a depletion type MISFET $M_D$ for making small a voltage which is impressed on the logical block $L_B$. The gate electrode of the MISFET $M_D$ is connected to a reference voltage terminal (ground terminal). An output OUT is taken out from the juncture 2 between the load MISFET $M_1$ and the depletion type MISFET $M_D$.

Where, for example, one transistor is used for the block $L_B$, the entire circuit in FIG. 1 can operate as an inverter circuit which inverts an input IN at the gate input terminal 3 of the driving transistor $M_{10}$ at the output terminal 2. Further, by using for the block $L_B$, a plurality of driving transistors connected in series or in parallel, the entire circuit of FIG. 1 can operate as a NAND circuit or a NOR circuit.

The foregoing logical circuit exemplifies a case where this invention is applied to the ratioless type logical circuit which drives the load MISFET $M_1$ by the use of a clock pulse CP impressed on a terminal 1.

According to this invention as explained above, the objects can be achieved as follows.

The potential of the juncture between the depletion type MISFET $M_D$ and the logical block $L_B$ does not become greater than the threshold voltage $|V_{th}|$ of the MISFET $M_D$ because the gate voltage of the depletion type MISFET $M_D$ is at ground potential. More specifically, the depletion type MISFET pinches off when the source voltage with respect to the gate voltage exceeds the threshold voltage $V_{th}$. Therefore, when the gate voltage is at ground potential the source voltage does not become greater than the threshold voltage $|V_{th}|$.

Consequently, the maximum voltage which is impressed between the drain and source of the driving MISFET $M_{10}$ constituting the logical block becomes the threshold voltage $|V_{th}|$ of the depletion type MISFET independent of a supply voltage $V_{DD}$ at a terminal 4. The channel length of the MISFET constituting the logical block is therefore determined uniquely, so that the design of the logical circuit is facilitated.

Since, in general, the threshold voltage $|V_{th}|$ of the depletion type MISFET is as small as 3V or so, the channel length of the driving MISFET constituting the logical block can be made a required minimum value irrespective of the supply voltage. It is therefore possible to attain enhancement of the density of integration of the logical circuit.

Figure 2:
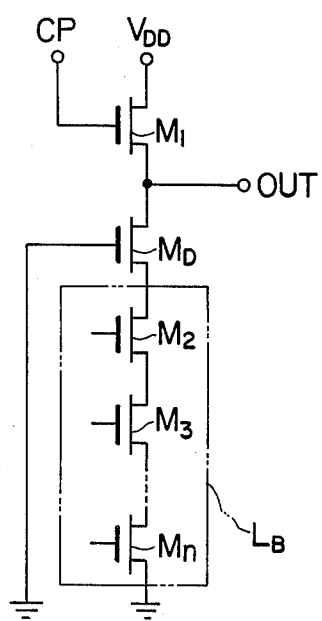

In particular, the density of integration is sharply enhanced in a complex gate circuit in which a large number of driving MISFETs $M_2$-$M_n$ —are connected in series as shown in FIG. 2, or in a ROM (read only memory) circuit.

This invention is not restricted to the embodiments described above, but it can adopt various aspects of performance.

By way of example, since the gate voltage $V_G$ of the depletion type MISFET $M_D$ serves to lower the voltage to be impressed on the logical block, it may have any value insofar as the following equation (1) is fulfilled:

$$|V_G| < |V_{DD}| - |V_{th}| \tag{1}$$

This invention can be similarly applied to the ratio type logical circuit. In this case, note should be taken of the fact that a level loss occurs in the depletion type MISFET.

Further, the output may be derived from the juncture between the depletion type MISFET and the logical block. In this case, note should be taken of the fact that the output amplitude is subject to a level shift (level-down).

This invention can be extensively utilized for MIS logical circuits.

I claim:
1. A logical circuit comprising:
a logic block including at least one input terminal and an output terminal, and at least one driving insulated gate field effect transistor connected between a respective input terminal and the output terminal of said logic block; and
a depletion type insulated gate field effect transistor and a load element connected in series between a load supply voltage terminal to which a supply voltage is applied and the output of said logic block; and wherein
the gate electrode of said depletion type insulated gate field effect transistor is applied with a voltage the absolute value of which is less than the difference between the absolute value of said supply voltage and the absolute value of the threshold voltage of said depletion type insulated gate field effect transistor.

2. A logical circuit according to claim 1, wherein said load element comprises an insulated gate field effect transistor the gate of which is coupled to a clock pulse terminal for receiving clock pulses.

3. A logical circuit according to claim 1, wherein the gate of said depletion type transistor is connected to ground potential.

4. A logical circuit according to claim 3, wherein said load element comprises an insulated gate field effect transistor the gate of which is coupled to a clock pulse terminal for receiving clock pulses.

* * * * *